(12) United States Patent
Jahnes et al.

(10) Patent No.: US 7,534,696 B2
(45) Date of Patent: May 19, 2009

(54) MULTILAYER INTERCONNECT STRUCTURE CONTAINING AIR GAPS AND METHOD FOR MAKING

(75) Inventors: Christopher V. Jahnes, Upper Saddle River, NJ (US); Satyanarayana V. Nitta, Poughquag, NY (US); Kevin S. Petrarca, Newburgh, NY (US); Katherine L. Saenger, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 116 days.

(21) Appl. No.: 11/429,708

(22) Filed: May 8, 2006

(65) Prior Publication Data

US 2007/0259516 A1 Nov. 8, 2007

(51) Int. Cl.
*H01L 21/76* (2006.01)
(52) U.S. Cl. .............................. 438/421; 257/E21.573; 257/E21.581; 438/619
(58) Field of Classification Search ................. 438/619, 438/421; 257/E21.573, E21.581
See application file for complete search history.

(56) References Cited

U.S. PATENT DOCUMENTS

| | | | |
|---|---|---|---|
| 5,461,003 A | 10/1995 | Havemann et al. | |
| 5,559,055 A | 9/1996 | Chang et al. | |
| 5,869,880 A | 2/1999 | Grill et al. | |
| 6,255,712 B1 | 7/2001 | Clevenger et al. | |
| 6,413,852 B1 * | 7/2002 | Grill et al. | 438/619 |
| 6,429,522 B2 | 8/2002 | Petrarca et al. | |
| 6,642,138 B2 * | 11/2003 | Pan et al. | 438/619 |
| 2005/0037604 A1 * | 2/2005 | Babich et al. | 438/619 |
| 2007/0210449 A1 * | 9/2007 | Caspary et al. | 257/734 |

* cited by examiner

*Primary Examiner*—Asok K Sarkar
(74) *Attorney, Agent, or Firm*—Scully, Scott, Murphy & Presser, P.C.; Robert M. Trepp, Esq.

(57) ABSTRACT

A multilevel air-gap-containing interconnect structure and a method of fabricating the same are provided. The multilevel air-gap-containing interconnect structure includes a collection of interspersed line levels and via levels, with via levels comprising conductive vias embedded in one or more dielectric layers in which the dielectric layers are solid underneath and above line features in adjacent levels, and perforated between line features. The line levels contain conductive lines and an air-gap-containing dielectric. A solid dielectric bridge layer, containing conductive contacts and formed by filling in a perforated dielectric layer, is disposed over the collection of interspersed line and via levels.

13 Claims, 8 Drawing Sheets

YOR920000421US1

Appln. No.11/429,708
Replacement Sheet

5/8

MULTILAYER INTERCONNECT STRUCTURE CONTAINING AIR GAPS AND METHOD FOR MAKING

CROSS REFERENCE TO RELATED APPLICATIONS

Cross reference is made to U.S. application Ser. No. 09/374,839 filed Aug. 14, 1999, now U.S. Pat. No. 6,255,712 by L. Clevenger et al. entitled "Semi Sacrificial Diamond for Air Dielectric Formation" and to U.S. application Ser. No. 09/742,976 filed Dec. 20, 2000, now U.S. Pat. No. 6,429,522 by K.S. Petrarca et al. entitled "Microprocessor Having Air as a Dielectric and Encapsulated Lines, Process for Manufacture," both directed to multilevel interconnect structures on integrated circuit chips incorporating a gaseous dielectric medium in at least one level, confined to within the chip by a dielectric encapsulant.

1. Field of the Invention

The present invention relates to air-gap-containing metal/insulator interconnect structures for Very Large Scale Integrated (VLSI) and Ultra Large Scale Integrated (ULSI) devices and packaging, and more particularly to structures, methods, and materials relating to the incorporation of air gaps into multiple levels of multilayer interconnect structures.

2. Background of the Invention

Device interconnections in Very Large Scale Integrated (VLSI) or Ultra-Large Scale Integrated (ULSI) semiconductor chips are typically effected by multilevel interconnect structures containing patterns of metal wiring layers called traces. Wiring structures within a given trace or level of wiring are separated by an intralevel dielectric, while the individual wiring levels are separated from each other by layers of an interlevel dielectric. Conductive vias are formed in the interlevel dielectric to provide interlevel contacts between the wiring traces.

By means of their effects on signal propagation delays, the materials and layout of these interconnect structures can substantially impact chip speed, and thus chip performance. Signal propagation delays are due to RC time constants wherein R is the resistance of the on-chip wiring, and C is the effective capacitance between the signal lines and the surrounding conductors in the multilevel interconnection stack. RC time constants are reduced by lowering the specific resistance of the wiring material, and by using interlevel and intralevel dielectrics (ILDs) with lower dielectric constants k (k of about 4.0 or less, preferably about 3.5 or less). All dielectric constants mentioned herein are relative to a vacuum unless otherwise noted.

A typical prior art metal/dielectric combination for low RC interconnect structures includes copper (Cu) metal with a dielectric such as $SiO_2$ (k on the order of about 4.0). Due to difficulties in subtractively patterning copper, copper-containing interconnect structures are typically fabricated by a Damascene process. In a Damascene process, metal patterns which inset in a layer of dielectric are formed by the steps of: (i) etching holes (for vias) or trenches (for wiring) into the interlevel or intralevel dielectric, (ii) optionally lining the holes or trenches with one or more adhesion or diffusion barrier layers, (iii) overfilling the holes or trenches with a metal wiring material, and (iv) removing the metal overfill by a planarizing process such as chemical mechanical polishing (CMP), leaving the metal even with the upper surface of the dielectric. This process is repeated until the desired number of wiring and via levels have been fabricated.

Fabrication of interconnect structures by Damascene processing can be substantially simplified by using a process variation known as Dual Damascene, in which patterned cavities for the wiring level and its underlying via level are filled in with a metal in the same deposition step. This reduces the number of metal polishing steps by a factor of two, providing substantial cost savings, but requires that a dual-relief pattern be introduced into the combined via plus wiring level dielectric.

Low-k alternatives to the dielectric $SiO_2$ include carbon-based solid materials such as diamond-like carbon (DLC), also known as amorphous hydrogenated carbon (a-C:H), fluorinated DLC (FDLC), SiCO or SiCOH compounds, and organic or inorganic polymer dielectrics. Nanoporous versions of $SiO_2$ and some carbon-based materials have even lower k values, while air gaps have the lowest k values of any material (k on the order of about 1.00). It is noted that the air in the air gap may comprise any gaseous material or vacuum.

Examples of multilayer interconnect structures incorporating air gaps are described, for instance, in U.S. Pat. No. 5,461,003, by R. H. Havemann et al.; U.S. Pat. No. 5,869,880, by A. Grill et al.; and U.S. Pat. No. 5,559,055, by M. S. Chang et al.

One preferred prior art method for forming air gaps utilizes a sacrificial place holding (SPH) material which is removed or extracted from beneath a solid, semi-permeable, or perforated bridge layer. Examples of SPH materials and removal methods include poly (meth methacrylate) (PMMA), poly-para-xylylene (Parylene™), amorphous carbon, and polystyrene, which may be removed by organic solvents, oxygen ashing and/or low temperature (approximately 200° C.) oxidation, norborene-based materials such as BF Goodrich's Unity Sacrificial Polymer™, which may be removed by low temperature (350°-400° C.) thermal decomposition into volatiles and a-Si or poly Si that is removed with $XeF_2$ vapor.

Compared to structures with solid dielectrics, air gap-based structures have lower thermal conductivity, reduced mechanical strength, and higher permeability to moisture and oxygen. Workable schemes for incorporating air gaps into interconnect structures must take these limitations into account. In addition, another concern with air gap dielectrics is that the dielectrics leave metal wiring features more susceptible to the opens and shorts induced by electromigration-driven mass transport, since the wiring features are no longer dimensionally constrained by being embedded in a solid dielectric.

Another concern is that structures with air gaps may not be as uniformly planar as structures built with intrinsically more rigid solid dielectrics. This can be a problem when the bridge layer sags over unsupported air gaps producing locally depressed areas. Any metal filling these depressed areas will remain in the structure after CMP and be a source of shorts and/or extra capacitance.

In view of the drawbacks mentioned hereinabove concerning prior art air-gap-containing interconnect structures, there is a continued need for developing new and improved air-gap-containing interconnect structures and methods for their fabrication.

SUMMARY OF THE INVENTION

The present invention provides a reliable, high-performance multilayer interconnect structure containing air gaps. More particularly, the present invention provides an air-gap-containing interconnect structure which is resistant to electromigration failure and environmental corrosion.

The present invention further provides an air-gap-containing interconnect structure which maximizes air gap volume fraction (relative to total volume fraction of dielectric), while minimizing the amount of unsupported wiring.

The present invention also provides a cost-effective and scalable method for fabricating multilevel interconnect structures incorporating air gaps.

In one embodiment of the present invention, the invention provides a method for forming air-gap-containing interconnect structures which minimizes the amount of potentially damaging processing that air gaps in the structure will experience during structure fabrication.

In yet another embodiment of the present invention, a method is provided that is capable of forming air-gap-containing interconnect structures which minimizes the number of extra steps associated with (i) extraction of the sacrificial place holder material, and (ii) forming, patterning, and pinching off bridge layers through which the sacrificial placeholder (SPH) must be removed.

In general terms, the present invention provides a multilevel air-gap-containing interconnect structure, and a workable, straightforward method for its fabrication. A preferred embodiment of the structure includes a combination "air-gap plus solid" via-level dielectric (with the solid dielectric only under the lines, and a perforated solid dielectric between the lines) plus a mostly air-gap line-level dielectric. The fabrication method builds up planar, dual damascene "via plus line level" pairs embedded in a dielectric matrix comprising a permanent, perforated dielectric in the via level, and a sacrificial place-holder (SPH) material in the line level. A dielectric bridge layer containing holes or perforations is formed on the structure after the desired number of level pairs has been assembled. The SPH in all the levels is then selectively removed through the perforated bridge layer, leaving the permanent dielectric behind. Because the SPH removal and air gap formation is performed all-at-once, at the end of the air-gap structure fabrication, the air gaps in the lower levels of the structure do not have to survive multiple levels of processing. After SPH extraction, the perforations in the bridge layer are pinched off by means of an additional dielectric deposition step.

In a variation of this first embodiment described above, additional wiring and via levels not containing air gaps may be built over the air-gap-containing structure to form a more complex interconnect structure containing air gaps in its lower line levels and solid dielectric in its upper line levels. In a second embodiment having much the same process sequence, dielectric sidewall spacers may be formed on the sidewalls of the lines and/or vias of the interconnect structure. While these spacers will increase the structure's effective dielectric constant $k_{eff}$, benefits are expected in mechanical and electromigration protection, and a reduced probability for arcing.

In general terms, the present invention provides a method for forming a multilayer interconnect structure including interconnected conductive wiring and vias spaced apart by a combination of solid and gaseous dielectrics, said method comprising:

(a) providing an initial structure comprising a patterned via-level dielectric including one or more permanent dielectric layers, said patterned via-level dielectric disposed on a first planar "line level" having conductive features embedded in a sacrificial place holder dielectric, and patterned through its entire thickness with cavities for vias and perforations for subsequent transport of said sacrificial place holder dielectric;

(b) forming a patterned next planar line-level layer of sacrificial place holder dielectric on said patterned via level dielectric, said next line-level dielectric patterned through its entire thickness with cavities for lines;

(c) lining said via and line cavities with one or more layers of conductive adhesion/barrier materials and filling said via and line cavities with a low resistivity conductive material to form a planar structure;

(d) forming a dielectric bridge layer having perforations therein over said planar structure; and (e) forming air gaps by at least partially extracting said place-holder material through said perforations.

In some embodiments of the present invention, steps (a)-(c) are repeated at least once (i.e., at least one more time) to provide a multilevel structure. It is noted that the term "low resistivity" is used throughout the instant application to denote a conductive material that has a bulk resistance of about 3 microohm-cm or less. The term "low k dielectric" denotes a dielectric material having a dielectric constant of about 4.0 or less.

Typically, the initial structure providing in step (a) of the present application is disposed on a substrate.

In addition to the method mentioned above, the present invention also provides a multilevel air-gap-containing interconnect structure comprising a collection of interspersed line levels and via levels, said line levels comprising conductive lines and an air-gap-containing dielectric and said via levels comprising conductive vias embedded in one or more dielectric layers, wherein said dielectric layers in said via levels are solid underneath and above line features in adjacent levels, and perforated between line features; and a solid dielectric bridge layer, containing conductive contacts disposed over said collection of interspersed line and via levels.

BRIEF DESCRIPTION OF THE DRAWINGS

These and other features, objects, and advantages of the present invention will become apparent upon a consideration of the following detailed description of the invention when read in conjunction with the drawings, in which.

DETAILED DESCRIPTION OF THE INVENTION AND PREFERRED EMBODIMENTS THEREOF

Figure 1A:
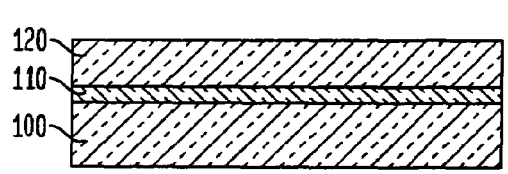
FIGS. 1A-1O show, in cross section view, the basic steps of the instant invention for forming an air-gap containing interconnect structure.

The present invention, which provides a high-performance multilayer interconnect structure containing air gaps, and a method of fabricating the same, will now be described in greater detail by referring to the following description and drawings that accompany the present application. It is noted that the drawings are provided for illustrative purposes, and as such, they are not drawn to scale. If not needed for understanding a particular drawing, reference numerals shown in a set of drawings are not repeated in subsequent drawings.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

Figure 1B:
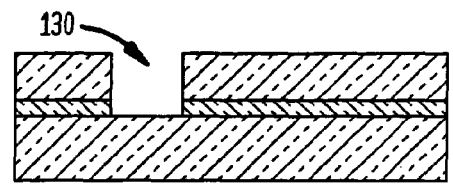
Figure 1C:
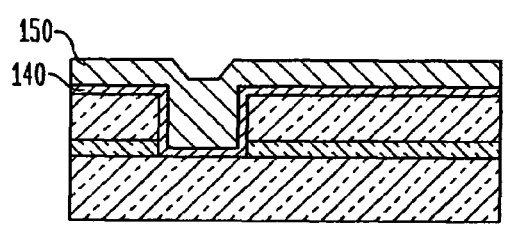
Figure 1D:
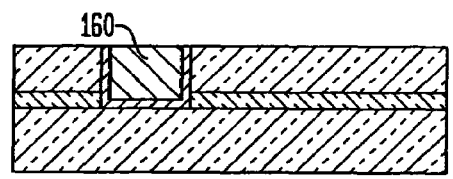
Figure 1E:
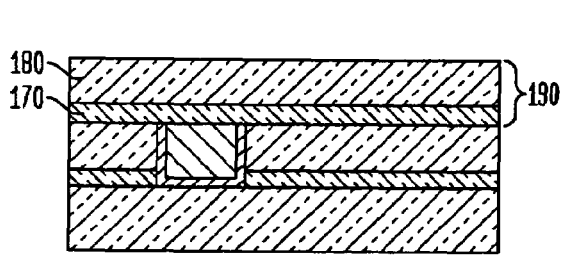
Figure 1F:
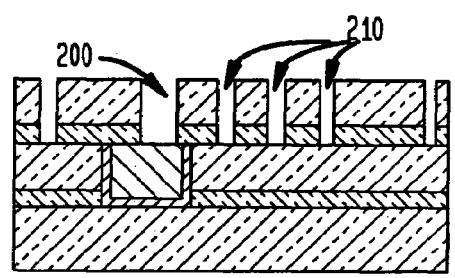
Figure 1G:
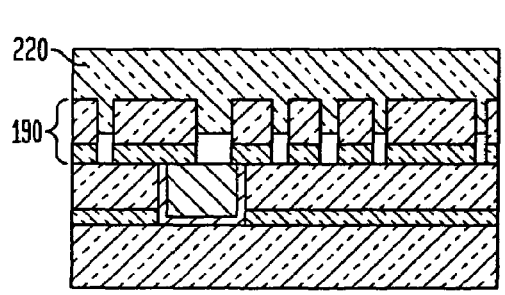
Figure 1H:
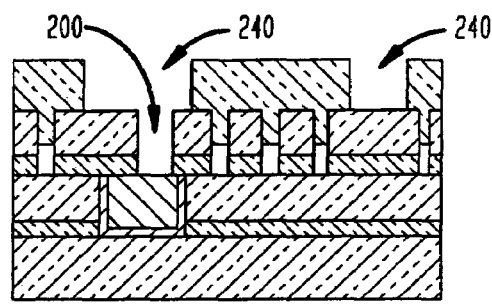
Figure 1I:
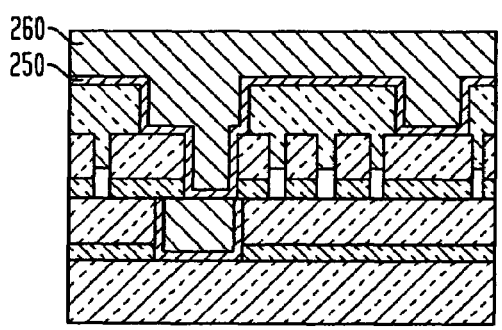
Figure 1J:
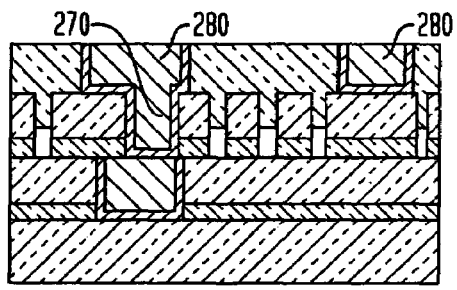
Figure 1K:
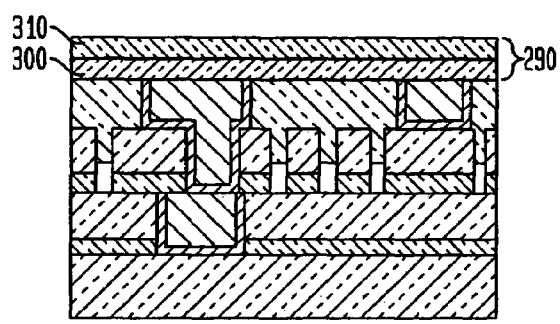
Figure 1L:
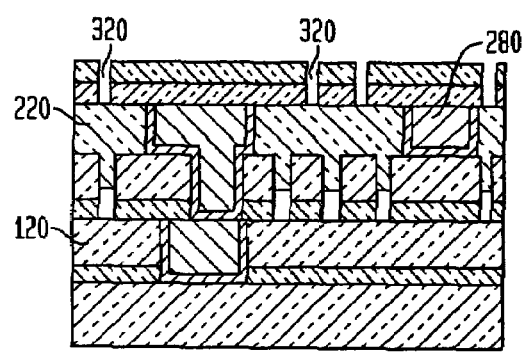
Figure 1M:
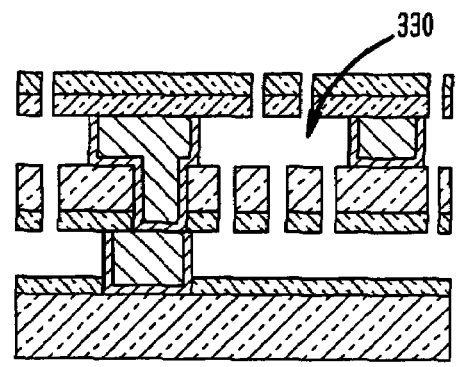
Figure 1N:
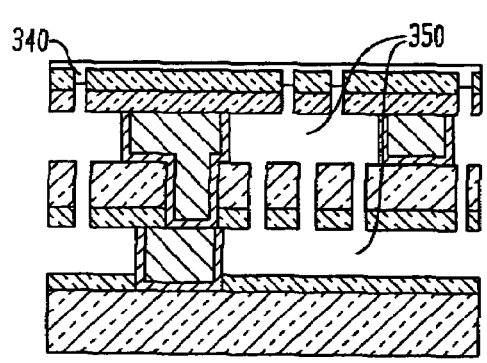
Figure 1O:
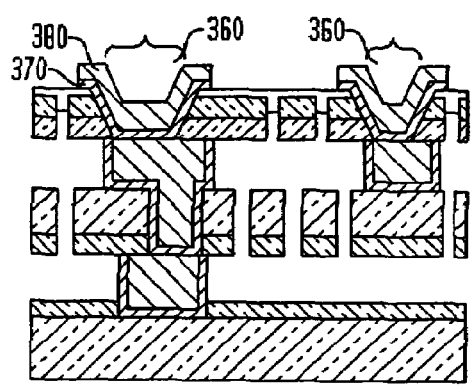

FIGS. 1A-1O show, in cross section view, the basic steps of the instant invention for forming an air-gap-containing interconnect structure. FIG. 1A shows a substrate 100 (which would normally comprise devices interspersed with conductive regions and insulating regions) after the application of an optional dielectric etch stop/barrier/adhesion layer 110 and a dielectric sacrificial place holder (SPH) layer 120 having a combined thickness approximately equal to the desired line level thickness.

FIG. 1B shows the structure of FIG. 1A after dielectric layers 110-120 have been patterned to form line cavities 130. Masking layers used to define line cavities 130 are not shown. The masking layers may be removed immediately after cavity formation, or at a time further along in the process (for example, after being used as a polish stop); alternatively, all or some part of the masking layers may remain in the final structure. Line cavities 130 are then lined with a conductive adhesion/diffusion barrier material 140 and then overfilled with a conductive wiring/via material 150, which may be the same or different from conductive material 140. The overfill is then removed by a process such as chemical mechanical polishing to leave the planar structure of FIG. 1D with conductive line structures 160.

FIG. 1E shows the structure of FIG. 1D after the application of optional dielectric etch stop/barrier/adhesion layer 170 and permanent dielectric 180 to form the combined via-level dielectric 190 having the approximate thickness desired for the conductive vias. Via-level dielectric 190 is then patterned with via cavities 200 (which will later be filled with conductive via material) and perforations 210 (through which SPH material 120 will later be extracted) to form the structure of FIG. 1F. A key component of the present invention is that the via cavities 200 and perforations 210 of FIG. 1F are defined at the same time, in a single masking step, thus saving the lithography and alignment steps that would be required if these features were defined separately. Perforations 210 would typically have the minimum lithography dimension, and are preferably positioned so as to (i) not terminate on conductive lines previously formed in the level below and (ii) not be terminated on by the lines that will be subsequently formed in the level above. Perforations 210 may be spaced apart by distances ranging from the minimum lithography dimension to several microns, depending on layout geometry, the mechanical strength of the via level dielectric containing densely spaced perforations, and the degree of access to the SPH material required for the desired efficiency of extraction. Perforations 210 may also be designed to have sub-minimum lithography dimensions, subject to the availability of advanced techniques (such as self-assembly) known to skilled practitioners of nanotechnology.

The via cavities 200 and perforations 210 of FIG. 1F may be formed by any etching processes known to those skilled in the art, such as reactive ion etching (RIE). Via cavities 200 and perforations 210 are preferably formed in a two-step RIE process wherein etch stop/barrier/adhesion layer 170 acts as an etch stop for RIE patterning of dielectric layer 180.

FIG. 1G shows the structure of FIG. 1F after application of a dielectric SPH layer 220 over patterned via level dielectric layer 190. SPH layer 220 has a planar upper surface, and a lower surface that may extend partially (as shown) or completely (not shown) into via cavities 200 and perforations 210. SPH layer 220 is then patterned by etching processes known to those skilled in the art, such as RIE, to form the structure of FIG. 1H with line-cavities 240. Preferably, permanent dielectric layer 180 acts as an etch stop for RIE patterning of SPH layer 220.

Line cavities 240, some of which are contiguous with via cavities 200, are then lined with a conductive adhesion/diffusion barrier material 250 and then overfilled with a conductive wiring/via material 260, which may be the same or different from conductive material 250, to form the structure of FIG. 1I. The overfill is then removed by a process such as chemical mechanical polishing to leave the planar structure of FIG. 1J. Note that conductive via structures 270 and line structures 280 were formed with only a single planarization step, a hallmark of dual damascene processing.

After the steps of FIGS. 1E-1J are repeated to form as many line and via levels as desired, dielectric bridge layer 290 is deposited to form the structure of FIG. 1K. Dielectric bridge layer 290 comprises an optional dielectric etch stop/barrier/adhesion layer 300 and a low-k dielectric layer 310. Dielectric bridge layer 290 is then patterned with perforations 320 (through which the SPH will subsequently be extracted) to produce the structure of FIG. 1L. Perforations 320 may be formed by any method known to the art; one preferred method would be reactive ion etching (RIE) through a lithographically defined mask. Perforations 320 preferably terminate on SPH material 220 rather than conductive line features 280. Perforations 320 may be closely spaced in areas where a high density of conductive features makes it important to remove as much of the SPH as possible, whereas perforations 320 may be sparsely spaced or absent in areas where it may be desirable to leave SPH in the structure to support the bridge layer.

SPH material 120 and 220 in FIG. 1L is then extracted to form the structure of FIG. 1M, with air gaps 330. Suitable extraction methods may include thermal decomposition (with or without reactive gases); plasma and/or reactive ion etching, with or without heat, in mixtures that may include H, $H_2$, O, $O_2$, N, $N_2$, F, $CF_4$, other halogen-containing gases, and/or Ar; vapor HF or $XeF_2$; wet etching methods; supercritical fluid (SCF) (e.g., $CO_2$) with or without additives or cosolvents. However, it is important that the extraction method be selective: the SPH must be removed without damaging the bridge layer, the permanent (via-level) dielectric, or the conductive wiring and liners. The choice of an optimal extraction method will thus be closely tied to the exact materials used for the SPH and permanent portions of the interconnect structure.

Finally, perforations 320 in dielectric bridge layer 300 are sealed. The perforations may be filled in, or "pinched off," by various deposition processes to form enclosed air gaps 350 such as shown in FIG. 1N. If desired, the material deposited in the pinchoff step may be planarized by a process such as chemical mechanical polishing, or by application of a planarizing dielectric followed by RIE. Pinched-off bridge layer 300/340 is then opened in selected places for additional contacts 360, comprising conductive adhesion/barrier layer 370 and conductive contact material 380 to produce the structure of FIG. 1O. Note that the contents of enclosed air gaps 350 may comprise Ar, $O_2$, $N_2$, He, $CO_2$, $SF_6$, $CF_4$, other gases, vacuum, or mixtures thereof, and that contacts 360 may alternatively have the form of vias for interconnection of additional wiring levels.

A preferred pinch off process might comprise the deposition of a 1 μm thick PECVD $SiO_2$ layer onto a 1 μm thick PECVD SiO$_2$ dielectric bridge layer prepatterned with 0.2 μm diameter holes or perforations. Perforations 320 may alternatively be sealed off by methods that do not require the deposition of a separate pinchoff layer. For example, perforations 320 may be induced to self-seal during the application of heat, immersion in plasma, e-beam irradiation, UV irradiation, and/or laser irradiation. Alternatively, pinch off layer 340 may be disposed in a selective manner so that the material of pinch off layer 340 preferentially plugs perforations 320 rather than accumulating over bridge layer 300.

The various dielectrics in the via and line levels including dielectrics 110, 120, 170 and 180 may be selected from the group consisting of silicon-containing materials such as amorphous hydrogenated silicon (a-Si:H), SiO$_2$, Si$_3$N$_4$, SiO$_x$N$_y$, SiC, SiCO, SiCOH, and SiCH compounds; these silicon-containing materials with some or all of the Si replaced by Ge; insulating metal oxides or nitrides; inorganic oxides, inorganic polymers; organic polymers such as polyimides or SiLK™; other carbon-containing materials; organo-inorganic materials such as spin-on glasses and silsesquioxane-based materials; diamond-like carbon (DLC, also known as amorphous hydrogenated carbon, a-C:H) with or without, one or more additives selected from the group containing F, N, O, Si, Ge, metals and nonmetals. Additional choices for one or more of the via and/or line level dielectrics include any of the aforementioned materials in porous form, or in a form that changes during processing to or from being porous and/or permeable to being non-porous and/or non-permeable. Dielectric layers 110, 120, 170 and 180 may also be mixtures, multilayers, or layered combinations of the aforementioned materials. Especially preferred choices for via level dielectric 190 comprise low-k barrier material such as SiCH for layer 170 and a SiO$_2$ or SiCOH-type material for layer 180.

Dielectric layers 110, 120, 170 and 180 may be formed from the same material, from different materials, or any combination. The dielectrics may be formed by various methods well known to those skilled in the art, including but not limited to: spinning from solution, spraying from solution, chemical vapor deposition (CVD), plasma enhanced CVD (PECVD), sputter deposition, reactive sputter deposition, ion-beam deposition, and evaporation.

Dielectric bridge layer 290 is preferably formed from one or more layers of one or more low-k materials, for example, single layers of SiO$_2$, a-Si:C:H (blok), SiCOH, or SiN$_x$; bilayers comprising a layer of SiO$_2$ over a layer of either SiN$_x$ or a-Si:C:H; trilayers comprising a top layer of SiN$_x$ or a-Si:C:H over a middle layer of SiO$_2$ over a bottom layer of SiN$_x$ or a-Si:C:H. However, any of the materials and deposition processes listed as possibilities for dielectrics 110, 120, 170 and 180 may be used.

SPH materials 120 and 220 are not required to be identical, low-k, or even dielectric. However, the SPH materials are preferably identical (for simplicity of processing), and preferably dielectric and low-k (so that any SPH residuals left after the extraction process will not short out the interconnect structure, or add significant capacitance). SPH materials 120 and 220 are preferably thermally stable enough to survive the various deposition and processing steps required prior to extraction.

Possible pairs of SPH and permanent via level dielectrics for which selective extraction processes exist include organics for the SPH and SiO$_2$ or SiCOH for the permanent dielectric, where the organics might be materials like SiLK™ (porous or not), polyimide, amorphous carbon a-C:H with, or without, additives, low thermal stability materials such poly (methy methacrylate) (PMMA), poly-para-xylylene (Parylene™), and norbornene-based materials such as BF Goodrich's Unity Sacrificial Polymer™, or any of the other organic materials listed as possibilities for dielectrics 110, 120, 170 and 180. More generally, other SPH/permanent via level dielectric combinations might be selected from any of the materials listed as possibilities for dielectrics 110, 120, 170 and 180.

The conductive line and via structures 150 and 260 would typically be formed from the following metals or their alloys: Al, Cu, Au, Ag, W, Al—Cu, Cu—Al, Cu—In, Cu—Sn, Cu—Mg, and CuSi. The conductive adhesion/diffusion barriers 140 and 250 would typically be one or more layers selected from the groups of: metal nitrides including TaN, TiN, TaAlN, TiAlN; metal silicon nitrides; metals including Ta, Cr, Co, Co—P, Co—W—P, Ni, Ni—P, Pd, W, Al; metal silicides; alloys, mixtures and multilayers of aforementioned materials. These conductive materials may be formed by various methods well known to those skilled in the art, including but not limited to: spinning from solution, spraying from solution, chemical vapor deposition (CVD), plasma enhanced CVD (PECVD), sputter deposition, reactive sputter deposition, ion beam deposition, electroless or electrolytic plating, and evaporation.

Figure 2A:
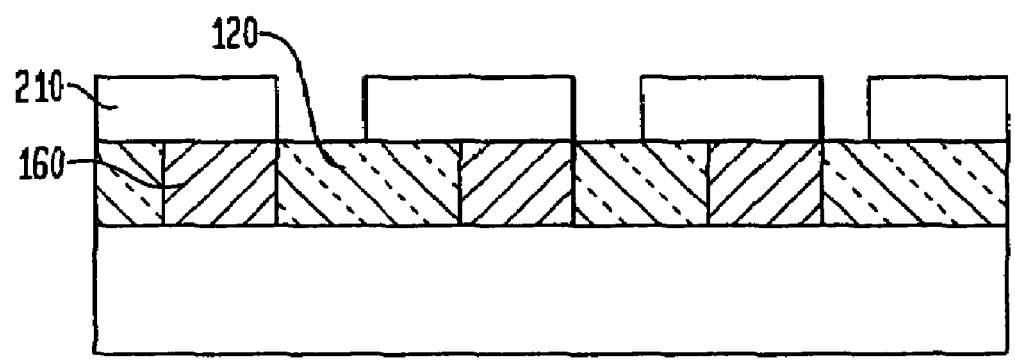
FIGS. 2A-2C show exemplary results for one of the process steps.
Figure 2B:
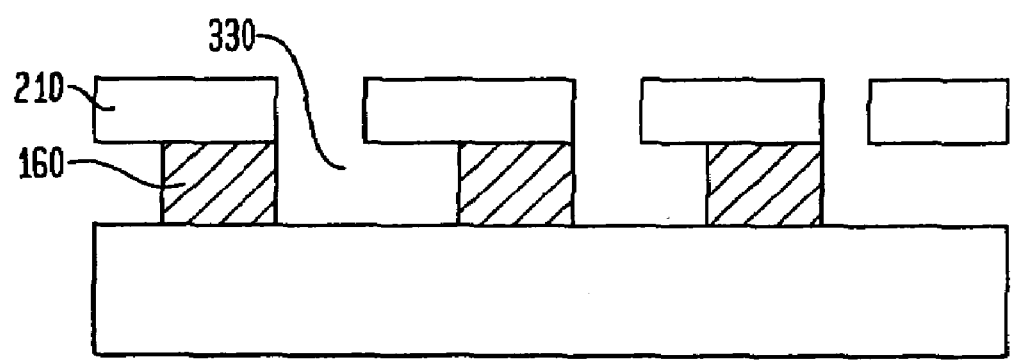
Figure 2C:
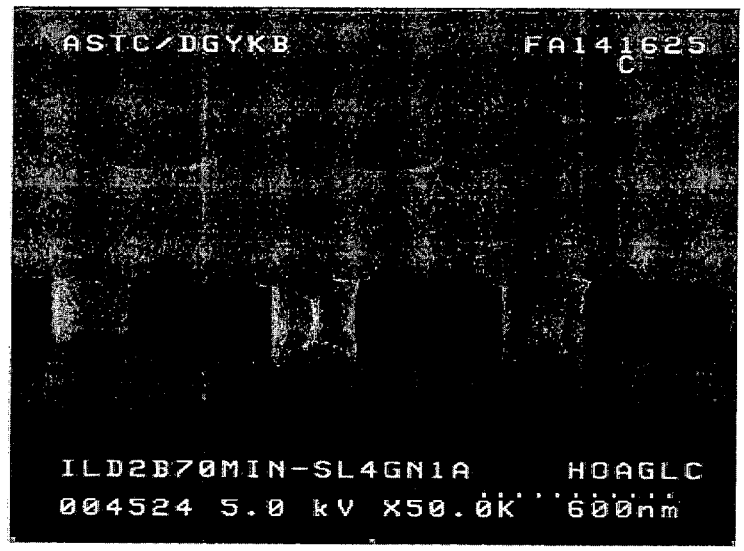

FIGS. 2A-2C show exemplary results for the SPH extraction step, for one preferred choice of materials. FIGS. 2A-2B show a schematic of a single layer wiring structure before and after SPH extraction through a perforated bridge layer, and FIG. 2C shows a scanning electron micrograph of the FIG. 2B structure for the case of Cu wiring, an organic diamond-like carbon (a-C:H) SPH material prepared by PECVD, and an SiO$_2$ bridge layer. SPH extraction was performed with a high pressure (1000 mTorr) O$_2$ RIE process using an rf power of 70 W (corresponding to a power density of approximately 0.22 W/cm$^2$), 150° C. substrate temperature, and 60 sccm O$_2$ flow. Under these conditions, the lateral etch rate of the SPH material was about 10 to 13 μm/hr. FIG. 2C shows a sample after 70 min of etching.

Figure 3A:
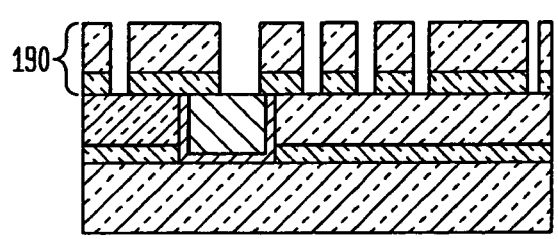
FIGS. 3A-3E illustrate, in cross section view, two approaches for forming functionally identical approximations to the structure of FIG. 1G.
Figure 3B:
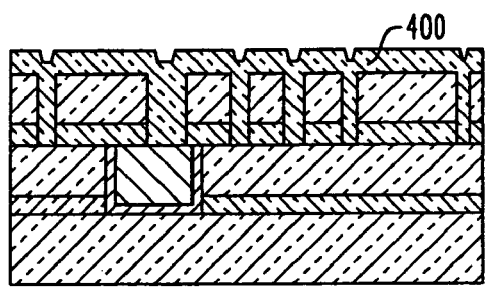
Figure 3C:
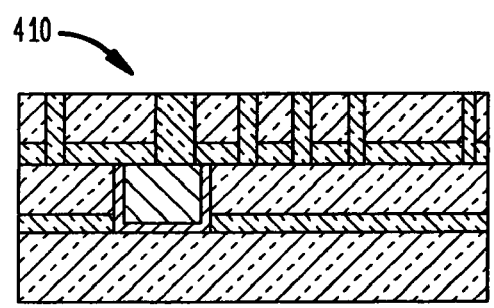
Figure 3D:
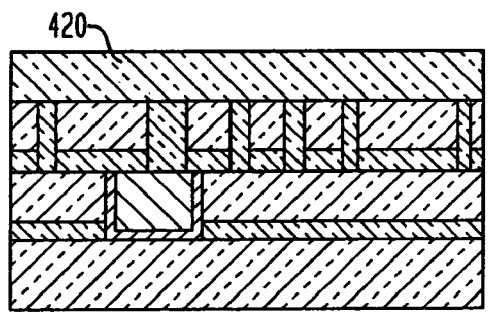
Figure 3E:
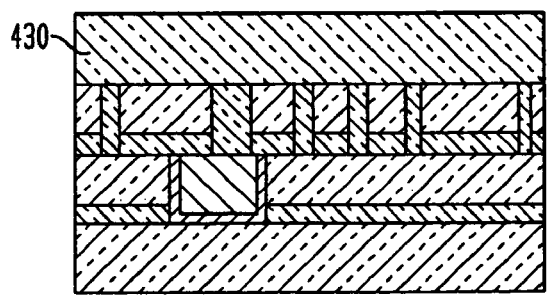

FIGS. 3A-3E illustrate, in cross section view, two approaches for forming SPH layer 220 which was shown in FIG. 1G as partially extending into via cavities 200 and perforations 210. SPH layer 220 may be fully gap-filling, partially gap-filling (as shown in FIG. 1G), or not gap-filling at all. FIG. 3B shows the structure of FIG. 3A with patterned via-level dielectric 190 after application of a fully gap-filling SPH layer 400 which may be planarized by a process such as CMP to form the structure of FIG. 3C with planar surface 410. A second SPH layer 420 is then formed on planar surface 410 to form the equivalent of SPH layer 220 in FIG. 1G. Alternatively, one may select an SPH material that exhibits little or no gap filling, to produce the structure of FIG. 3E with SPH layer 430, where SPH layer 430 is equivalent to SPH layer 220 in FIG. 1G. SPH materials 400, 420 and 430 are selected from the set of materials previously described for SPH materials 120 and 220.

FIGS. 4A-4D show, in cross section view, possible methods for forming dielectric sidewall spacers on wiring and/or via features. Dielectric sidewall spacers on the sidewalls of the conductive line features may serve several key functions. First, the spacers provide a mechanical constraint of the conductor against electromigration-driven mass transport of conductive material out of the wiring structures. This helps prevent opens caused by diffusion of wiring material out of the original wiring to leave a cavity, and shorts caused by the build up of wiring material outside the original wiring to form a protrusion. In addition, the dielectric sidewall spacers can protect the wiring from exposure to gaseous environmental contaminants in the air gap (such as oxygen), and block possible migration pathways for atoms of wiring material which might otherwise find their way to the semiconductor substrate. However, it should be noted that these spacers do come at the cost of a higher $k_{eff}$ for the structure, and additional process steps.

Figure 4A:
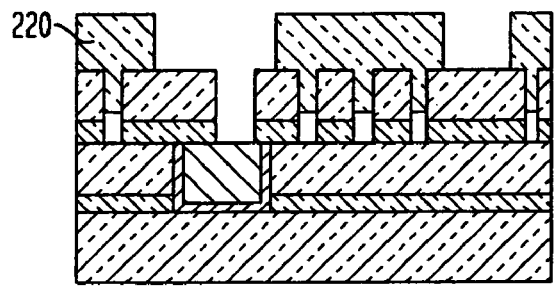
FIGS. 4A-4D show, in cross section view, possible methods for forming dielectric sidewall spacers on wiring and/or via features.
Figure 4B:
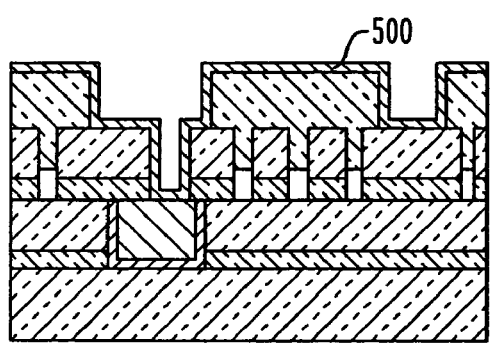
Figure 4C:
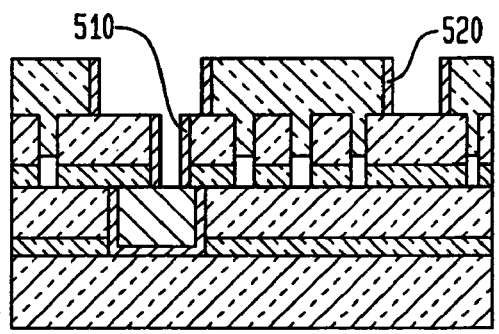
Figure 4D:
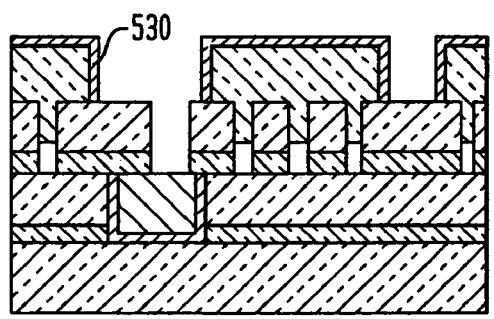

Dielectric sidewall spacers are preferably formed from low k materials, such as $SiO_2$, a-Si:C:H (blok), SiCOH, silsesquioxane-based materials, Si-containing organics, and $SiN_x$. However, any of the materials and deposition processes listed as possibilities for dielectrics 110 and 120 may be used. A preferred process sequence for forming these dielectric sidewall spacers is shown in FIGS. 4A-4C. Dielectric spacer material 500 is deposited on the structure of FIG. 4A as a conformal liner layer to produce the structure of FIG. 4B; spacer material 500 is then anisotropically etched by a process such as RIE to remove exposed horizontal areas and leave via level sidewall spacers 510 and line level sidewall spacers 520 as shown in FIG. 4C. Alternatively, as shown in FIG. 4D, dielectric sidewall spacers 530 and 540 may be formed from the structure of FIG. 4A by modifying the exposed surfaces of a sacrificial line level dielectric 220 to form sidewall spacer layers that are resistant to the extraction process used to remove the unmodified SPH. This approach has the advantage that the sidewall spacer layer is applied only to the line level cavity sidewalls (where it is needed), rather than to both the line and via level cavity sidewalls. Examples of modification processes include (i) silylation of an organic SPH to form a silicon-containing material that is resistant to oxygen ashing, and (ii) plasma-induced surface densification/modification of a porous SPH.

Figure 5A:
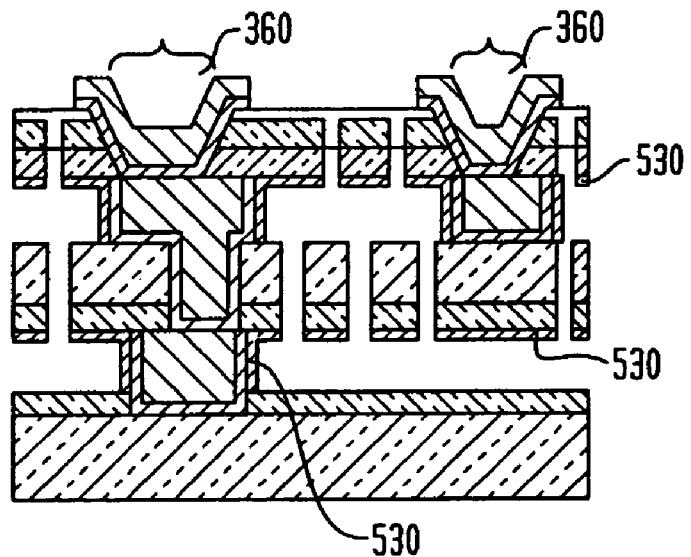
FIGS. 5A-5B show, in cross section view, two structure variations resulting from variations of the basic method of the present invention.
Figure 5B:
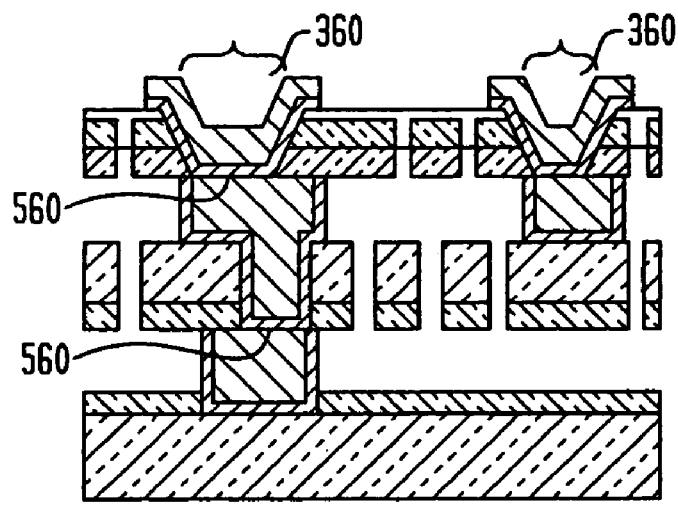

FIGS. 5A-5B show, in cross section view, alternatives to the structure of FIG. 1O that may be made with the methods of this invention. FIG. 5A shows an example of a variation of the structure of FIG. 1O made with dielectric sidewall spacers 530 (formed by modification of the SPH) incorporated into each layer of the structure. It should be noted that dielectric sidewall spacers may be incorporated into none, some, or all of the interconnect structure layers, and that FIG. 5A illustrates the case of a structure with sidewall spacers at the line levels only.

FIG. 5B shows how a selective, electroless metal (e.g., Co—P, Co—W—P, Ni—P, etc.) plating process might be used to form protective coatings 560 on the exposed surfaces of the conductive wiring. In a preferred embodiment, these plating steps would be introduced prior to deposition of the next level's via dielectric, for example, to the planarized structure of FIGS. 1D and/or FIG. 1J.

While the present invention has been described in an illustrative manner, it should be understood that the terminology used is intended to be in a nature of words of description rather than of limitation. Furthermore, while the present invention has been described in terms of several preferred embodiments, it is to be appreciated that those skilled in the art will readily apply these teachings to other possible variations of the inventions. In particular, while the invention has been described in detail for a single damascene lower line level plus a dual damascene upper "via plus line" level, the methods of the invention may be used to form structures containing any number of interconnected wiring levels, some or all formed by the methods of the present invention. In addition, while the invention has been described for the case in which a single damascene line level comprises the first (bottom-most) part of an interconnect structure formed on a substrate, suitable contacts in the substrate may allow this first part of the interconnect structure to be replaced by a dual damascene "via plus line" level embedded in a solid via level dielectric and sacrificial line level dielectric.

What is claimed is:

1. A method for forming a multilayer interconnect structure including interconnected conductive wiring and vias spaced apart by a combination of solid and gaseous dielectrics, said method comprising:
   (a) providing an initial structure comprising a patterned via-level dielectric including one or more permanent dielectric layers, said patterned via-level dielectric disposed on a first planar "line level" having conductive features embedded in a sacrificial place holder dielectric, and patterned through its entire thickness with cavities for vias and perforations for subsequent transport of said sacrificial place holder dielectric, wherein patterning of the vias and perforations comprises a single masking step;
   (b) forming a patterned next planar line-level layer of sacrificial place holder dielectric on said patterned via level dielectric, said next line-level dielectric is patterned through its entire thickness with cavities for lines;
   (c) lining said via and line cavities with one or more layers of conductive adhesion/barrier materials and filling said via and line cavities with a low resistivity conductive material to form a planar structure;
   (d) forming a dielectric bridge layer having perforations therethrough over said planar structure; and
   (e) forming air gaps by at least partially extracting said sacrificial place holder dielectric through said perforations, wherein the patterned via level dielectric including the one or more permanent dielectric layers having at least a portion present underlying the line cavities adjacent the vias, and sealing said perforations in said bridge layer with a pinch off dielectric material after said extracting said sacrificial place holder dielectric through said perforations.

2. The method of claim 1 wherein steps (a)-(c) are repeated at least once to provide a multilevel structure prior to performing step (d).

3. The method of claim 1 wherein the first planar "line level" is formed by the steps of:
   forming said sacrificial place holder dielectric having a thickness that approximates that of the desired line thickness;
   forming cavities corresponding to line patterns;
   blanket depositing one or more layers of conductive liner and/or baffler materials;
   overfilling with a low resistivity conductive material; and
   planarizing said conductive material to remove the both the overfill and conductive liner material external to said cavities.

4. The method of claim 1 wherein the first planar "line level" is replaced by a dual damascene "via+first tine level" pair having a solid permanent dielectric for an underlying via level and a sacrificial place holder dielectric for a line level dielectric.

5. The method of claim 1 wherein said pinchoff dielectric being the same or different from the material of the dielectric bridge layer.

6. The method of claim 1 further comprising forming a sidewall spacer on at least some of the conductive line and/or via features.

7. The method of claim 6 wherein said forming the sidewall spacer comprises
   forming a liner of sidewall spacer material along sidewalls and a bottom wall of a cavity formed by patterning said sacrificial place holder dielectric, and anisotropically etching said sidewall spacer material to remove it from the bottom wall of the cavity while leaving it on the sidewalls.

8. The method of claim 6 wherein forming the sidewall spacer comprises converting exposed sidewall portions of the sacrificial place holder dielectric to a non-extractable permanent dielectric.

9. The method of claim 1 farther comprising selectively applying an electroless metal to exposed and planarized conductive line surfaces.

10. The method of Claim 1 wherein the sacrificial place holder dielectric is removed by at least one of thermal decomposition, wet etching, vapor HF or $XeF_2$ etching, plasma etching, or reactive ion etching.

11. The method of claim 1 wherein said SCE extraction utilizes SCF $CO_2$, with or without cosolvent additives.

12. The method of claim 1 wherein said extracting of said sacrificial place holder dielectric is by supercritical fluid (SCE) extraction.

13. The method of claim 1 wherein the perforations have a diameter on the order of approximately 2 microns.

* * * * *